United States Patent
Ryan et al.

(10) Patent No.: US 6,774,053 B1
(45) Date of Patent: Aug. 10, 2004

(54) METHOD AND STRUCTURE FOR LOW-K DIELECTRIC CONSTANT APPLICATIONS

(75) Inventors: Errol Todd Ryan, Austin, TX (US); Cindy K. Goldberg, Austin, TX (US); Yuri Solomentsev, Allen, TX (US); Yeong-Jyh T. Lii, Austin, TX (US)

(73) Assignees: Freescale Semiconductor, Inc., Austin, TX (US); Advanced Micro Devices, Inc., Sunnyvale, CA (US)

( * ) Notice: Subject to any disclaimer, the term of this patent is extended or adjusted under 35 U.S.C. 154(b) by 23 days.

(21) Appl. No.: 10/384,350

(22) Filed: Mar. 7, 2003

(51) Int. Cl.[7] ............................................. H01L 21/31
(52) U.S. Cl. ..................... 438/780; 438/781; 438/788; 438/624; 257/759; 257/760
(58) Field of Search ................................ 438/780, 781, 438/788, 623, 624, 790; 257/759, 760

(56) References Cited

U.S. PATENT DOCUMENTS

| | | | |
|---|---|---|---|
| 6,037,664 A | 3/2000 | Zhao et al. | |
| 6,072,227 A | 6/2000 | Yau et al. | |
| 6,153,528 A | 11/2000 | Lan | |
| 6,156,651 A | * 12/2000 | Havemann | 438/674 |
| 6,204,202 B1 | * 3/2001 | Leung et al. | 438/781 |
| 6,255,233 B1 | 7/2001 | Smith et al. | |
| 6,350,700 B1 | 2/2002 | Schinella et al. | |
| 6,413,846 B1 | 7/2002 | Besser et al. | |
| 6,413,877 B1 | 7/2002 | Annapragada | |
| 6,418,875 B1 | 7/2002 | Annapragada | |
| 6,436,824 B1 | 8/2002 | Chooi et al. | |
| 6,455,417 B1 | 9/2002 | Bao et al. | |

OTHER PUBLICATIONS

Laxman, Ravi K. et al. *Synthesizing Low–k CVD Materials for Fab Use*, Semiconductor International vol. 23, No. 13, pp 95–100 (2000).

Clarke, Michael E. *Introduction Low–k Dielectrics into Semiconductor Processing*, www.mykrolis.com.

* cited by examiner

*Primary Examiner*—Caridad Everhart
(74) *Attorney, Agent, or Firm*—Kenneth C. Brooks

(57) ABSTRACT

The present invention provides a low-k dielectric constant structure and method of forming the same on a substrate 10 that features having a dielectric layer 20 with differing regions of density 12 and 18. To that end, the method includes depositing, upon the substrate, a dielectric layer having first and second density regions. The density associated with the second density region being greater than the density associated with the first density region, and the first density region being disposed between the substrate and the second density region.

11 Claims, 2 Drawing Sheets

METHOD AND STRUCTURE FOR LOW-K DIELECTRIC CONSTANT APPLICATIONS

BACKGROUND OF THE INVENTION

The field of invention relates generally to the fabrication of integrated circuits. More particularly, the invention relates to a process and apparatus for forming dielectric layers on a semiconductor substrate.

The fabrication of modern semiconductor devices includes forming multiple layers of conductive and dielectric materials on substrates. Formation of these layers occurs through various processes, chemical vapor deposition (CVD), plasma enhanced CVD (PECVD), atomic layer deposition (ALD), physical vapor deposition (PVD) and the like.

The semiconductor industry strives to increase the number of semiconductor devices formed per unit area on the substrate. As a result, the feature size of the semiconductor devices continues to decrease. This has resulted in a doubling of the number of semiconductor devices present in a unit area every two years, referred to as Moore's Law.

As the feature sizes associated with semiconductor devices decrease, the deleterious effects of the electrical characteristics of the materials from which the conductive and dielectric layers are formed increase. For example, the Resistance-Capacitance (RC) delay introduced by the aforementioned materials limits the operational speed of the semiconductor devices. As a result, there have been many attempts of alleviating RC delays in semiconductor devices.

Conventionally, RC delays are alleviated by employing materials having low dielectric constants, k. Many of the low dielectric materials, however, have properties that are incompatible with other materials employed to fabricate semiconductor devices or are incompatible with processes employed to fabricate the semiconductor devices. For example, adhesion to layers formed from a low dielectric constant material by adjacent layers is often poor, resulting in delamination. Additionally, layers formed from low dielectric materials are often structurally compromised by Chemical Mechanical Polishing (CMP) processes through erosion, as well as adsorption of CMP slurry chemicals. Etching processes often produce micro-trenches and rough surfaces in layers formed from materials having low dielectric constants, which is often unsuitable for subsequent photolithography processes. As a result, these materials are problematic to integrate into damascene fabrication processes.

Therefore, a need exists to provide improved techniques for producing semiconductor structures having layers formed from materials having low dielectric constants.

DETAILED DESCRIPTION OF THE INVENTION

Figure 1:
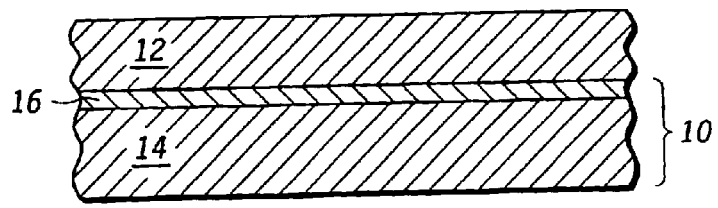
FIG. 1 is a cross-sectional view illustrating a low-k dielectric layer disposed upon a substrate including a silicon nitride film in accordance with the present invention.

Referring to FIG. 1, a substrate 10 is shown having a dielectric layer 12 disposed thereon. The dielectric constant associated with layer 12 is typically less than about 4.0, defining a low-k dielectric constant, with a preferred range of 1.5 to 3.0. Substrate 10 typically includes a wafer 14 that may be formed from any known material, such as silicon, and may include any number of layers, e.g., such as interconnect wiring layers or contacts to active and passive components. In the present example, substrate 10 includes wafer 14 having a passivation layer 16 formed from silicon nitride, SiN. Passivation layer 16 may be any desired thickness, e.g., in a range of approximately 100 angstroms to 2,000 angstroms or greater.

Low-k dielectric layer 12 may be formed from any known dielectric material having suitable dielectric properties, depending upon the application. Low-k dielectric layer 12 may be any desired thickness, e.g., in a range of 300 to 5,000 angstroms, but may be thinner to minimize capacitance. In the present example, low-k dielectric layer 12 is formed from an organosilicate glass (OSG) having a composition of $Si_wC_xO_yH_z$. Low-k dielectric layer 12 may be deposited using known techniques, such as CVD, PECVD and the like and may have any desired thickness, e.g., 1,000 to 5,000 angstroms or more.

Figure 2:
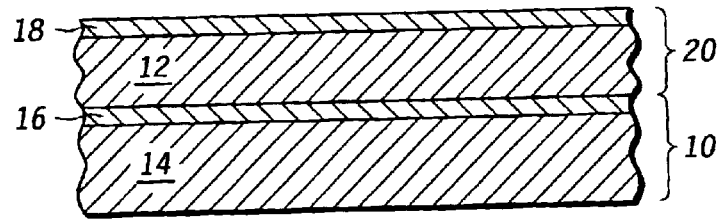
FIG. 2 is a cross-sectional view illustrating a densified dielectric layer disposed upon the low-k dielectric layer, shown in FIG. 1, in accordance with the present invention.

Referring to FIG. 2, formed adjacent to low-k dielectric layer 12 is a densified dielectric layer 18. Densified dielectric layer 18 may be any known type in the semiconductor art having a suitable dielectric constant, depending upon the application. Densified dielectric layer 18 may be any desired thickness, e.g. in a range of 200 to 1,000 angstroms. In the present example, it is desired to form densified dielectric layer 18 from materials having minimal dielectric constants, while demonstrating good adhesion properties to low-k dielectric layer 12. Additionally, densified dielectric layer 18 should maintain electrical integrity when subjected to etching and chemical mechanical polishing (CMP) processes. It was found that these characteristics were satisfied by forming densified dielectric layer 18 from material having the basic chemical composition as low-k dielectric layer 12, as well as having less porosity (greater density) than low-k dielectric layer 12. To that end, densified dielectric layer 18 is formed from an additional organosilicate glass film with a porosity that is lower than the porosity of the low-k dielectric layer 12.

The differing porosity between low-k dielectric layer 12 and densified dielectric layer 18, may be achieved by any known means in the art. For example, as is well known in the art, the porosity of materials, such as OSG, may be controlled by including thermally unstable organic dopants. Suitable material for use in dielectric layers 12 and 18 may be obtained from various manufacturers by simply providing to the manufacture a value of the desired dielectric constant that the material should have. These materials are available from Japan Synthetic Rubber Co., Ltd. of Tokyo, Japan, under the trade-name JSR LKD; Shipley Company, L.L.C. of Marlborough, Mass. under the trade-name ZIRKONO®; and Honeywell International of Morristown, N.J. under the trade-name NANOGLASSO®. The organic dopants produce pores, pockets of air, throughout the material, thereby lowering the dielectric constant associated therewith. As a result, in one manner in which to provide dielectric layers 12 and 18 with differing porosities is to provide a greater amount of the thermally unstable organic dopants in dielectric layer 12 than are present in densified dielectric layer 18. In the present example, low-k dielectric layer 12 was deposited having the thermally unstable organic dopants using spin-on techniques. Densified dielectric layer 18 was deposited in a similar manner without any thermally unstable organic dopants being present therein employing CVD techniques. It should be understood that the porosity of layers 12 and 18 may also be controlled by regulating an amount of carbon molecules present. To that end, densified dielectric layer 18 would be provided with a greater quantity of carbon molecules than low-k dielectric layer 12.

It is believed that the adhesion of low-k dielectric layer 12 to densified dielectric layer 18 was improved, because the two layers were formed from materials having a similar composition. Specifically, using a four-point bend test it was determined that the adhesion was improved by about a factor of two. Further, the lower porosity of densified dielectric layer 18 demonstrates characteristics necessary to maintain structural integrity during subsequent CMP and etching processes that are typically used when forming, inter alia, conductive contacts. In this manner, the low-k dielectric layer 12 and densified dielectric layer 18 define a stacked dielectric layer 20 having first and second density regions. The first density region is low-k dielectric layer 12. The second density region is densified dielectric layer 18. Densified dielectric layer 18 functions as a cap layer of the stacked dielectric layer 20 overcoming the drawbacks associated with the lower density second density region. In this manner, densified dielectric layer 18 reduces, if not prevents, CMP slurry chemicals from compromising the structural and electrical integrity of stacked dielectric layer 20. This avoids formation of micro-trenching and surface roughening during etch processes, i.e., when used as an etch-stop layer (ESL) in dual damascene applications.

Figure 3:
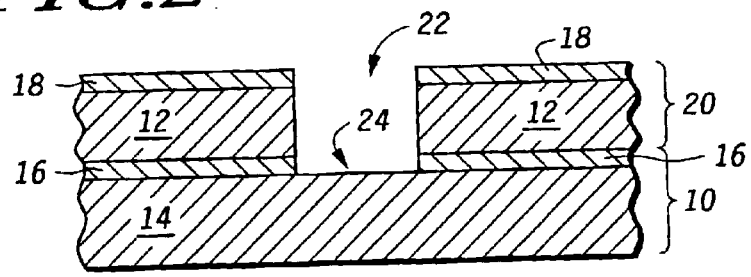
FIG. 3 is a cross-sectional view illustrating trench formation through both the dielectric layers shown in FIG. 2 in accordance with the present invention.
Figure 4:
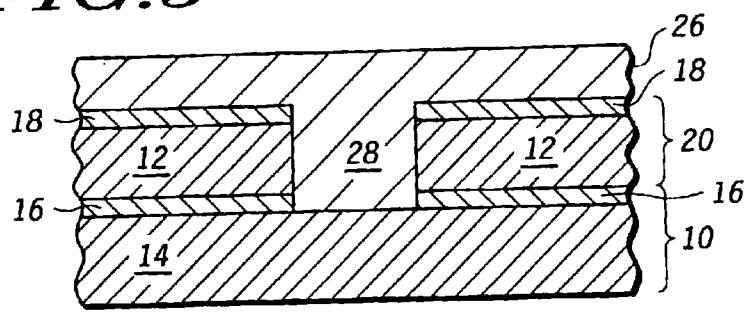
FIG. 4 is a cross-sectional view through a width of a line that is formed by deposition of a conductive film in the trench shown in FIG. 3.

For example, referring to FIGS. 3 and 4, a conductive contact is formed by creating a trench 22 through stacked dielectric layer 20 and passivation layer 16, exposing a region 24 of wafer 14. Trench 22 may be formed using any known etching process in the art. After formation of trench 22 a conductive layer 26, such as aluminum, copper or the like, is deposited. Conductive layer 26 may be deposited using any known process, such as CVD, electroplating and the like. A portion of conductive layer 26 fills trench 22 forming a line 28.

Figure 5:
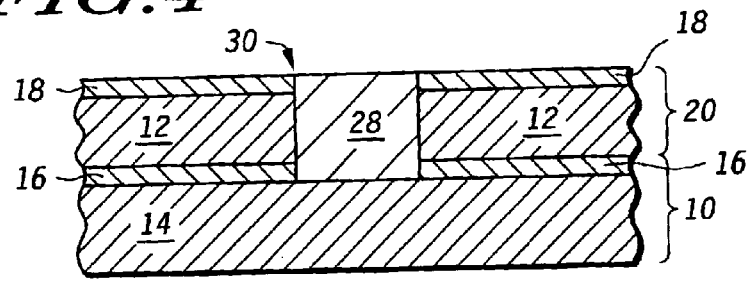
FIG. 5 is a cross-sectional view illustrating planarization of the conductive film shown in FIG. 4 in accordance with the present invention.

Referring to FIGS. 4 and 5, conductive layer 26 is subjected to a CMP process, planarizing line 28 to form a substantially planar and contiguous surface that includes densified dielectric layer 18. In addition to the superior adhesion, compared to conventional cap layers, the increased density of densified dielectric layer 18 makes the same resistant to absorption of the slurry chemicals associated with CMP processes, while having a removal rate more closely matched to the removal rate of conductive layer 26. Thus, the stacked dielectric layer 20 is less likely to absorb the CMP slurry chemicals and more likely to form a substantially planar surface 30, compared to not having densified dielectric layer 18 present and without unduly increasing the dielectric constant of stacked dielectric layer 20.

Figure 6:
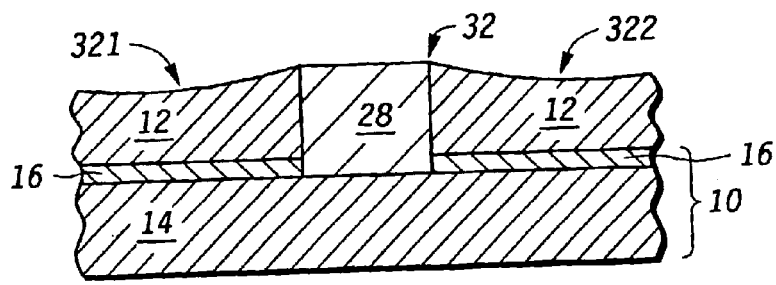
FIG. 6 is a cross-sectional view illustrating a planarization of the film stack shown in FIG. 5, without the densified dielectric layer being present.

Superior planarization of surface 30 provided by densified dielectric layer 18 is realized by comparing FIGS. 5 and 6. Surface 32 is shown having concave, or arcuate, regions 321 and 322 flanking line 28. The presence of arcuate regions 321 and 322 substantially undermines the planarity of surface 32, making the same less planar than surface 30. Regions 321 and 322 occur in the absence of densified dielectric layer 18, because the substantially higher removal rate of the porous low-k dielectric layer 12 compared to the removal rate of line 28 and as compared to densified dielectric layer 18. In this manner, densified dielectric layer 18 functions as a low-k dielectric constant cap layer. It should be understood that the dielectric constant, density and, therefore, removal rate may be controlled by the quantity of carbon dopant in densified dielectric layer 18.

Figure 7:
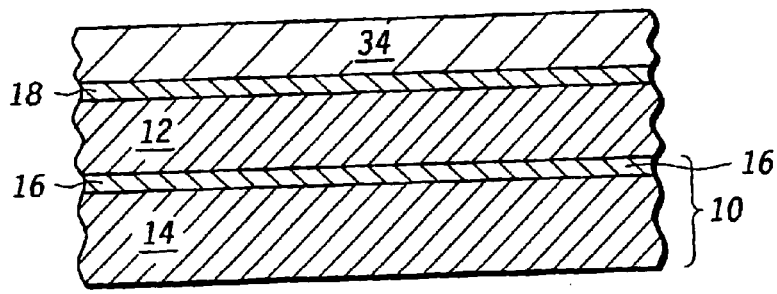
FIG. 7 is a cross-sectional view illustrating the stacked dielectric layer shown in FIG. 2 including a trench layer disposed adjacent to the densified dielectric layer, in accordance with an alternate embodiment of the present invention.

Referring to FIG. 7, taking advantage of the superior adhesion properties demonstrated by densified dielectric layer 18, it is believed that by properly doping densified dielectric layer 18, its adhesion properties may be modified to increase adhesion of two adjacent layers. As shown, densified dielectric layer 18 may be disposed between two layers formed from materials having low dielectric constants associated therewith. This is shown as low-k dielectric layer 12 and another dielectric layer, such as trench layer 34. Trench layer 34 may be formed from the same material as low-k dielectric layer 12 or differing materials. In this manner, trench layer 34 may be formed from materials that would otherwise not be suitable for use with dielectric layer 12 due to, for example, poor adhesion characteristics. As a result, densified dielectric layer 18 functions as a glue layer having a low-k dielectric constant associated therewith. In this embodiment, densified dielectric layer 18 also functions as an etch-stop layer and may be used in a dual-damascene process.

Figure 8:
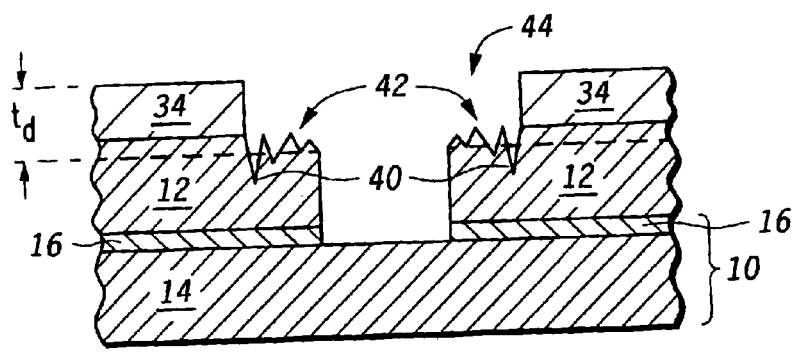
FIG. 8 is a cross-sectional view illustrating the film stack shown in FIG. 7 in which a via and a trench are formed using conventional dual damascene processes and with the densified dielectric layer not being present.
Figure 9:
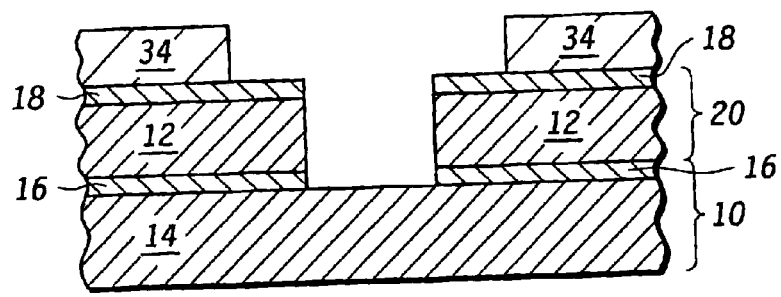
FIG. 9 is a cross-sectional view illustrating a stacked dielectric layer shown in FIG. 2 including an additional layer disposed adjacent thereto with a via and a trench formed therein using conventional etching processes.

Referring to FIGS. 8 and 9, stacked dielectric layer 20 has been found to demonstrate superior characteristics during etching processes. Specifically, without the presence of densified dielectric layer 18, as shown in FIG. 8, etching processes result in formation of micro-trenches 40 and a jagged surface 42 when forming a trench 44 in trench layer 34. As a result, it is often difficult to obtain a desired trench depth $t_d$.

With densified dielectric layer 18, shown in FIG. 9, control of the trench depth $t_d$ is facilitated that reduces, if not avoids, formation of micro-trenches 40 and jagged surface 42. Additionally, the implementation of a carbon dopant in densified dielectric layer 18 improves etch selectivity of stacked dielectric layer 20. This occurs when using fluorine-based etch chemistries, because carbon-doped materials have a greater removal rate than non-carbon-doped materials. Thus, the selectivity may be optimized as a function of the carbon content of densified dielectric layer 18 and the thickness of the same. Such etch selectivity makes use of densified dielectric layer 18 attractive for use in a dual damascene process, e.g., as shown in FIG. 9.

The etch selectivity is further improved by forming stacked dielectric layer 20 with an organic dielectric layer (not shown), an OSG film, as well as densified dielectric layer 18. Organic dielectrics are efficiently etched using oxygen-based chemistries, and oxygen-based etch chemistries having deminimis effects on carbon-doped materials, such OSG film. Alternatively, low-k dielectric layer 12 may be formed from an organic dielectric material and densified dielectric layer 18 may be formed from OSG material to provide improved etch selectivity.

The embodiments of the present invention described above are exemplary. Many changes and modifications may be made to the disclosure recited above, while remaining within the scope of the invention. For example, as mentioned above, the dielectric layers are formed from materials having a $Si_wC_xO_yH_z$ composition. However, it should be noted that other dielectric materials may be employed while till being within the scope of the present invention. Therefore, this invention is not limited to particular forms illustrated above. Rather, the appended claims cover all modifications that do not depart from the spirit and scope-of this invention.

What is claimed is:

1. A method of forming a dielectric structure on a substrate, said method comprising:

depositing, upon said substrate, a low-k dielectric layer; and depositing, upon said low-k dielectric layer, a densified dielectric layer, with both said low-k dielectric and said densified dielectric layers being formed from materials having a common set of molecules to improve adhesion of said densified dielectric layer to said low-k dielectric layer, with said densified dielectric layer having a greater density than said low-k dielectric layer.

2. The method as recited in claim 1 wherein said common set of molecules consists essentially of molecules of organosilicate glass.

3. The method as recited in claim 1 wherein said low-k dielectric layer is formed from organosilicate glass having a first porosity associated therewith and said densified dielectric layer is formed from organosilicate glass having a second porosity associated therewith that is less than said first porosity.

4. The method as recited in claim 1 further comprising depositing a trench layer adjacent to said densified dielectric layer and forming a trench in said trench layer employing an etch process having an etch chemistry associated therewith, with said etch chemistry selectively etching said densified dielectric layer to control trench depth.

5. The method as recited in claim 1 further comprising depositing a trench layer adjacent to said densified dielectric layer.

6. The method as recited in claim 1 further comprising forming a layer of silicon nitride on said substrate positioned between said low-k dielectric layer and said substrate, forming a trench through said densified dielectric layer, said low-k dielectric layer and said silicon nitride-layer, and forming a copper film in said trench.

7. A dielectric structure disposed on a substrate, said structure comprising:

a low-k dielectric layer; and a densified dielectric layer disposed adjacent to said low-k dielectric layer, with said low-k dielectric layer being positioned between said substrate and said densified dielectric layer, with both said low-k dielectric and said densified dielectric layers being formed from materials having a common set of molecules to improve adhesion of said densified dielectric layer to said low-k dielectric layer, with said densified dielectric layer having a greater density than said low-k dielectric layer.

8. The structure as recited in claim 7 wherein said common set of molecules consists essentially of molecules of organosilicate glass.

9. The structure as recited in claim 7 wherein said low-k dielectric layer is formed from organosilicate glass having a first porosity associated therewith and said densified dielectric layer is formed from organosilicate glass having a second porosity associated therewith that is less than said first porosity.

10. The structure as recited in claim 7 further comprising a layer of silicon nitride disposed on said substrate between said low-k dielectric layer and said substrate, and a conductive film extending through said densified dielectric layer, said low-k dielectric layer and said silicon nitride layer, terminating proximate to said substrate.

11. The structure as recited in claim 10 wherein said conductive film is formed from copper.

* * * * *